United States Patent
Heink et al.

(10) Patent No.: US 7,403,215 B2
(45) Date of Patent: Jul. 22, 2008

(54) CURRENT DRIVER AND POWER CONTROL FOR ELECTROPHOTOGRAPHIC DEVICES

(75) Inventors: Philip Jerome Heink, Lexington, KY (US); Daniel Richard Klemer, Lexington, KY (US); Stanley Coy Tungate, Jr., Lexington, KY (US); Eric Wayne Westerfield, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 203 days.

(21) Appl. No.: 11/466,195

(22) Filed: Aug. 22, 2006

(65) Prior Publication Data

US 2008/0049093 A1  Feb. 28, 2008

(51) Int. Cl.
  *B41J 2/435* (2006.01)
  *B41J 2/47* (2006.01)
  *H01S 3/13* (2006.01)

(52) U.S. Cl. .................. 347/237; 347/247; 372/29.011

(58) Field of Classification Search ......... 347/236–237, 347/246–247; 372/29.01–29.16, 38.1
See application file for complete search history.

(56) References Cited

U.S. PATENT DOCUMENTS

| 5,027,362 | A | | 6/1991 | Hokanson et al. |
| 5,138,623 | A | | 8/1992 | Ema et al. |
| 5,651,017 | A | | 7/1997 | Genovese |
| 5,912,694 | A | * | 6/1999 | Miyake et al. ............... 347/247 |
| 6,118,798 | A | * | 9/2000 | Ema et al. .............. 372/29.011 |
| 6,266,078 | B1 | * | 7/2001 | Koga et al. ................... 347/236 |
| 6,370,175 | B1 | | 4/2002 | Ikeda et al. |
| 6,907,055 | B2 | * | 6/2005 | Morley et al. ............... 372/38.1 |
| 6,917,639 | B2 | | 7/2005 | Ishida et al. |

* cited by examiner

*Primary Examiner*—Hai C Pham
(74) *Attorney, Agent, or Firm*—Stevens & Showalter, LLP

(57) ABSTRACT

Laser driver systems and methods are provided for controlling a laser driver coupled to a suitable laser source. The laser driver comprises a plurality of current sources, including at least one bias current source and at least two switched current sources. To control the laser driver, a laser power control signal is provided for each switched current source that corresponds to a desired laser output power. An output power error measure is defined based upon an error between a measured laser output power and the desired laser output power for each switched current source and a control system is characterized in which the output power error measures combine to change a magnitude of each of the switched current sources and the bias current source(s) such that the output power error measures converge over time.

20 Claims, 5 Drawing Sheets

CURRENT DRIVER AND POWER CONTROL FOR ELECTROPHOTOGRAPHIC DEVICES

BACKGROUND OF THE INVENTION

The present invention relates to electrophotographic devices, and in particular, to current driver circuits and methods of controlling current driver circuits in electrophotographic devices.

In electrophotography, an imaging system forms a latent image by exposing select portions of an electrostatically charged photoconductive surface to laser light. For example, the imaging system may sweep a laser beam across the photoconductive surface in a scan direction as the photoconductive surface advances in a process direction that is orthogonal to the scan direction. For each sweep of the beam, a corresponding laser is modulated to write a plurality of print elements (Pels). Essentially, the density of the electrostatic charge on the photoconductive surface is altered in areas exposed to the laser beam relative to those areas unexposed to the laser beam, thus forming a latent image on the photoconductive surface in a manner that corresponds with associated image data. The latent electrostatic image thus created is developed into a visible image by exposing the photoconductive surface to toner, which contains pigment components and thermoplastic components. When so exposed, the toner is attracted to the photoconductive surface in a manner that corresponds to the electrostatic density altered by the laser beam.

The toner pattern is subsequently transferred from the photoconductive surface to the surface of a print substrate, such as paper, which has been given an electrostatic charge opposite that of the toner. A fuser assembly then applies heat and pressure to the toned substrate before the substrate is discharged from the apparatus. The applied heat causes constituents including the thermoplastic components of the toner to flow into the interstices between the fibers of the medium and the applied pressure promotes settling of the toner constituents in these voids. The toner solidifies as it cools adhering the image to the substrate.

Due to inherent imprecision in the imaging system, the swept beam may have bow and/or skew in its scan path. Moreover, there may be nonlinearity in the spacing between adjacent Pels due to imprecision in the imaging system optics. To compensate for such scanning errors, it is known to subdivide each Pel into a plurality of slices, i.e., subPels. During printing operations, the imaging system attempts to compensate for scanning errors by selectively controlling the number of slices per Pel and/or selectively controlling for each Pel, which slices the laser beam is modulated ON and which slices the laser beam is modulated OFF. However, as scan rates increase, e.g., due to increased printed page rates, the time available to the imaging system to write each slice of each Pel decreases. This places a burden on the imaging system, including the video control functions, the data transmission paths, and the laser diode driver(s) to reliably produce the short video pulse Pel slices.

BRIEF SUMMARY OF THE INVENTION

The present invention provides systems and methods for controlling a laser driver coupled to a laser source in an electrophotographic device. The laser driver comprises a plurality of current sources, including at least one bias current source and at least two switched current sources. To control the laser driver, a laser power control signal is provided for each switched current source that corresponds to a desired laser output power. An output power error measure is defined based upon an error between a measured laser output power and the desired laser output power for each switched current source and a control system is characterized in which the output power error measures combine to change a magnitude of each of the switched current sources and the bias current source(s) such that the output power error measures converge over time.

During a non-printing portion of a scan operation, laser power may be sampled for each of the switched current sources and the magnitudes of the switched current sources and the bias current source(s) may be adjusted based upon the characterized control system and the sampled laser power for each of the switched current sources. For example, given a system with two switched current sources and a single bias current source, the control system may be characterized such that:

$$\frac{di_0}{dt} = -\eta k(p_2 - p_1 - r_0); \frac{di_1}{dt} = -\eta k(p_2 - p_0 - r_1); \text{ and}$$

$$\frac{di_B}{dt} = +\eta k(p_2 - p_1 - p_0);$$

wherein $\eta$ defines a differential efficiency of the laser source, k is a scalar constant, p0 corresponds to a first sampling of laser output power when the laser source is driven by a first one of the switched current sources, p1 corresponds to a second sampling of the laser output power when the laser source is driven by a second one of the switched current sources and p2 corresponds to a third sampling of the laser output power when the laser source is driven simultaneously by both the first one and the second one of the current sources.

BRIEF DESCRIPTION OF THE SEVERAL VIEWS OF THE DRAWINGS

The following detailed description of the preferred embodiments of various embodiments of the present invention can be best understood when read in conjunction with the following drawings, where like structure is indicated with like reference numerals, and in which.

DETAILED DESCRIPTION OF THE INVENTION

In the following detailed description of the illustrated embodiments, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of various embodiments of the present invention.

An Exemplary Electrophotographic Imaging Apparatus

Figure 1:
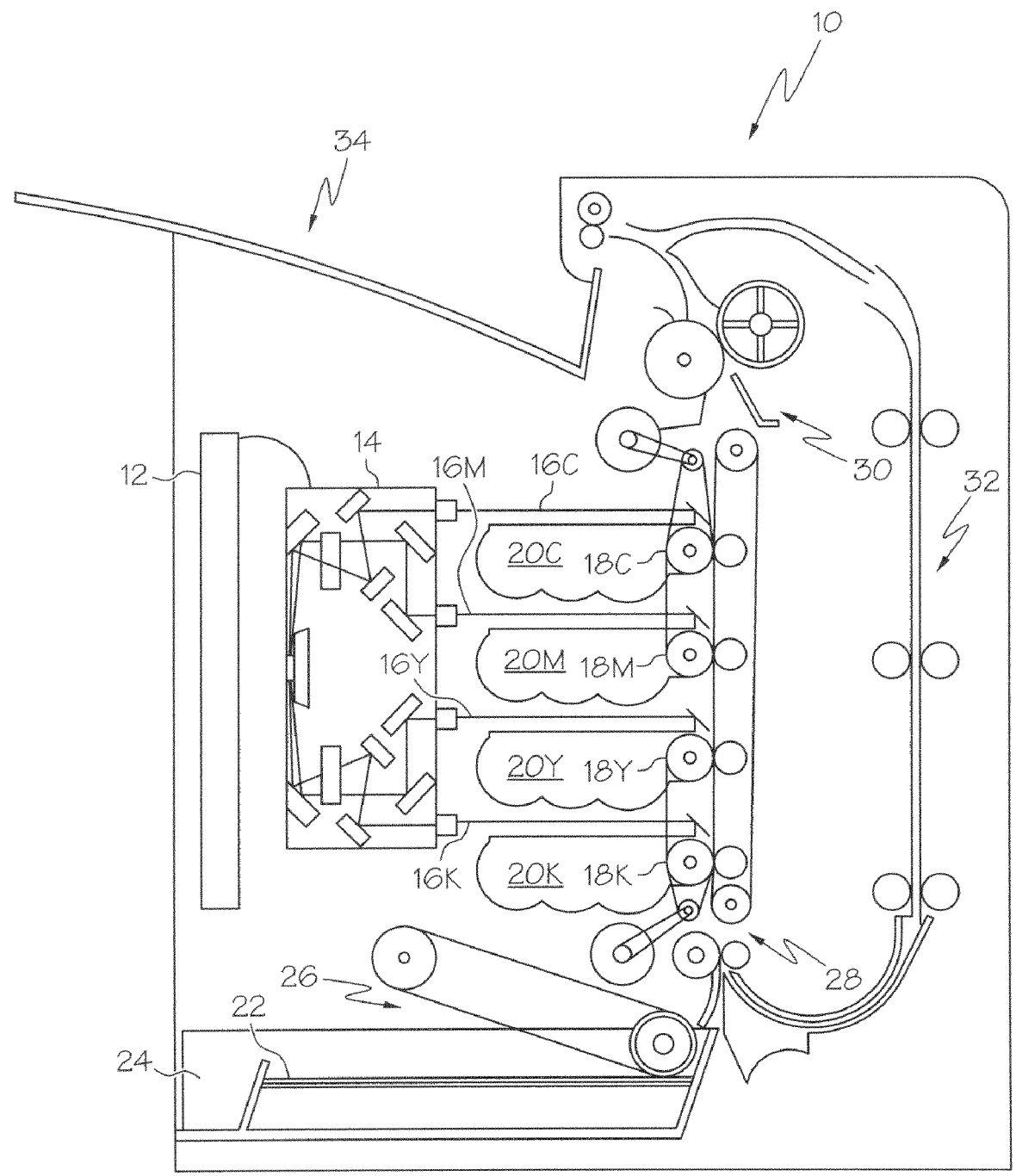
FIG. 1 is a schematic illustration of an exemplary electrophotographic apparatus.

Referring now to the drawings, and particularly to FIG. 1, an apparatus, which is indicated generally by the reference numeral 10, is illustrated for purposes of discussion herein as a color laser printer. An image to be printed is electronically transmitted to a main system controller 12 by an external device (not shown). The main system controller 12 includes system memory, one or more processors, and other software and/or hardware logic necessary to control the functions of electrophotographic imaging.

For color operation, the image to be printed is de-constructed into four bitmap images, each corresponding to an associated one of the cyan, yellow, magenta and black (CYMK) image planes, e.g., by the main system controller 12 or by the external device. The main system controller 12 then initiates an imaging operation whereby a printhead 14 outputs first, second, third and fourth modulated laser beams 16K, 16Y, 16M and 16C respectively.

The first modulated laser beam 16K forms a latent image on a photoconductive drum 18K of a first image forming station 20K based upon the bitmap image data corresponding to the black image plane. The second modulated laser beam 16Y forms a latent image on a photoconductive drum 18Y of a second image forming station 20Y based upon the bitmap image data corresponding to the yellow image plane. The third modulated laser beam 16M forms a latent image on a photoconductive drum 18M of a third image forming station 20M based upon the bitmap image data corresponding to the magenta image plane. Similarly, the fourth modulated laser beam 16C forms a latent image on a photoconductive drum 18C of a fourth image forming station 20C based upon the bitmap image data corresponding to the cyan image plane. During the imaging operation, each modulated laser beam 16K, 16Y, 16M, 16C sweeps across its corresponding photoconductive drum 18K, 18Y, 18M and 18C in a scan direction that is perpendicular to the plane of FIG. 1.

The main system controller 12 also coordinates the timing of a printing operation to correspond with the imaging operation, whereby a top sheet 22 of a stack of media is picked up from a media tray 24 by a pick mechanism 26 and is delivered to a media transport belt 28. The media transport belt 28 carries the sheet 22 past each of the four image forming stations 20K, 20Y, 20M and 20C, which apply toner to the sheet 22 in patterns corresponding to the latent images written to their associated photoconductive drums 18K, 18Y, 18M and 18C. The media transport belt 28 then carries the sheet 22 with the toned mono or composite color image registered thereon to a fuser assembly 30. The fuser assembly 30 includes a nip that applies heat and pressure to adhere the toned image to the sheet 22. Upon exiting the fuser assembly 30, the sheet 22 is either fed into a duplexing path 32 for printing on a second surface thereof, or the sheet 22 is ejected from the apparatus 10 to an output tray 34.

An Exemplary Printhead

Figure 2:
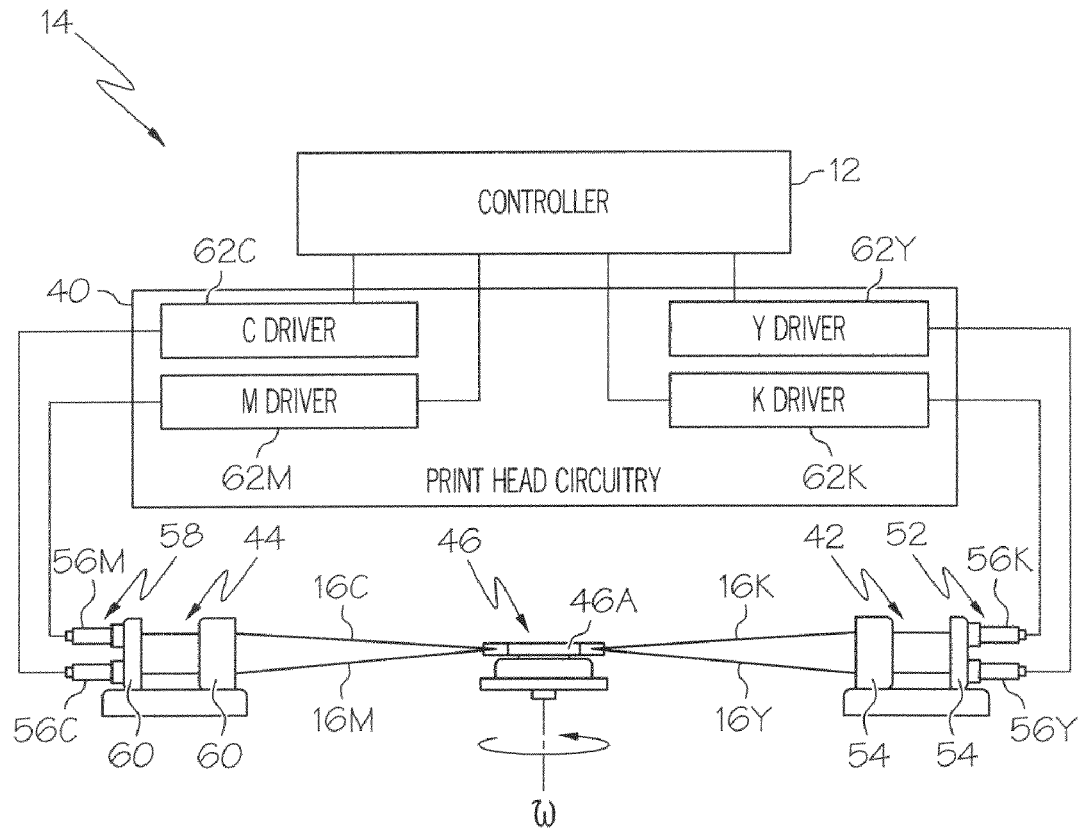
FIG. 2 is a block diagram of select components of an exemplary printhead, which may be utilized with the device of FIG. 1, illustrating laser sources coupled to corresponding circuitry.

Referring to FIG. 2, an exemplary printhead 14 includes generally, printhead circuitry 40 that is communicably coupled to the controller 12 for exchange of image data and control data between the printhead 14 and the controller 12, first and second pre-scan assemblies 42, 44, a rotating polygon mirror 46 having a plurality of facets 46A and a post scan optical system having one or more post scan optical components (not shown in FIG. 2).

The first pre-scan assembly 42 comprises a first laser assembly 52 and a first pre-scan optical system 54. As illustrated, the first laser assembly 52 comprises a first pair of laser sources including a first laser source 56K that is associated with the black image plane and a second laser source 56Y that is associated with the yellow image plane Similarly, the second pre-scan assembly 44 comprises a second laser assembly 58 and a second pre-scan optical system 60. The second laser assembly 58 comprises a second pair of laser sources including a third laser source 56M that is associated with the magenta image plane and a fourth laser source 56C that is associated with the cyan image plane. The first, second, third and fourth laser sources 56K, 56Y, 56M, 56C may each be implemented, for example, using a laser diode or other suitable light source.

The first and second pre-scan optical systems 54, 60 each comprise one or more collimating lenses, pre-scan lenses and/or other optical system components as the specific implementation requires to direct and focus each of the modulated beams 16K, 16Y, 16M and 16C emitted by their associated first, second, third and fourth laser sources 56K, 56Y, 56M, 56C towards the polygon mirror 46.

The printhead circuitry 40 comprises a first driver circuit 62K that is coupled to the first laser source 56K, a second driver circuit 62Y that is coupled to the second laser source 56Y, a third driver circuit 62M that is coupled to the third laser source 56M, and a fourth laser driver 62C that is coupled to the fourth laser source 56C.

During an imaging operation, the polygon mirror 46 is controlled to rotate at a fixed rotational velocity ($\omega$) and each light source 56K, 56Y, 56M and 56C is driven to emit a modulated beam 16K, 16Y, 16M and 16C corresponding to its associated one of the CYMK image data, which is communicated from the controller 12 to associated drivers 62K, 62Y, 62M, 62C on the printhead circuitry 40. The first pair of beams 16K, 16Y each strike a first one of the facets of the polygon mirror and the second pair of beams 16M, 16C each strike a second one of the facets that is different from the first one of the facets. A scan line is formed each time a new facet intercepts its pair of beams.

Post scan optics are used to direct each modulated beam 16K, 16Y, 16M, 16C to their corresponding photoconductive drum 18K, 18Y, 18M and 18C as best illustrated in FIG. 1 The post scan optical components may each be provided as part of the printhead 14 or such components may be otherwise mounted within the apparatus 10.

Although FIGS. 1-2 illustrate an exemplary multi-beam printhead and corresponding apparatus, other configurations may alternatively be implemented. For example, the photoconductive drums 18K, 18Y, 18M and 18C may be replaced with a photoconductive belt or other types of photoconductive surface(s). Moreover, the photoconductive surface(s) may transfer the toned image to an intermediate device such as an electrically conductive intermediate transport belt that subsequently carries the toned image to the sheet 22. As another example, a single photoconductive surface may be used to image each color plane in sequential processing steps. Also, while a single printhead 14 is illustrated, a separate printhead may alternatively be provided for each image forming station 20K, 20Y, 20M and 20C. Additionally, other printhead and optical system configurations may be implemented, including providing a separate printhead for each laser source.

The Optical Scanner

The overall print quality of the apparatus 10 is sensitive to the optical output of the laser sources 56k, 56Y, 56M, 56C. However, optical power requirements are known to vary widely, e.g., as much as 100% or more, from laser diode to laser diode. To account for such variations, each laser driver circuit 62K, 62Y, 62M, 62C of the printhead circuitry 40 comprise power management circuitry, which is described in detail below.

Laser Control Topology

Figure 3:
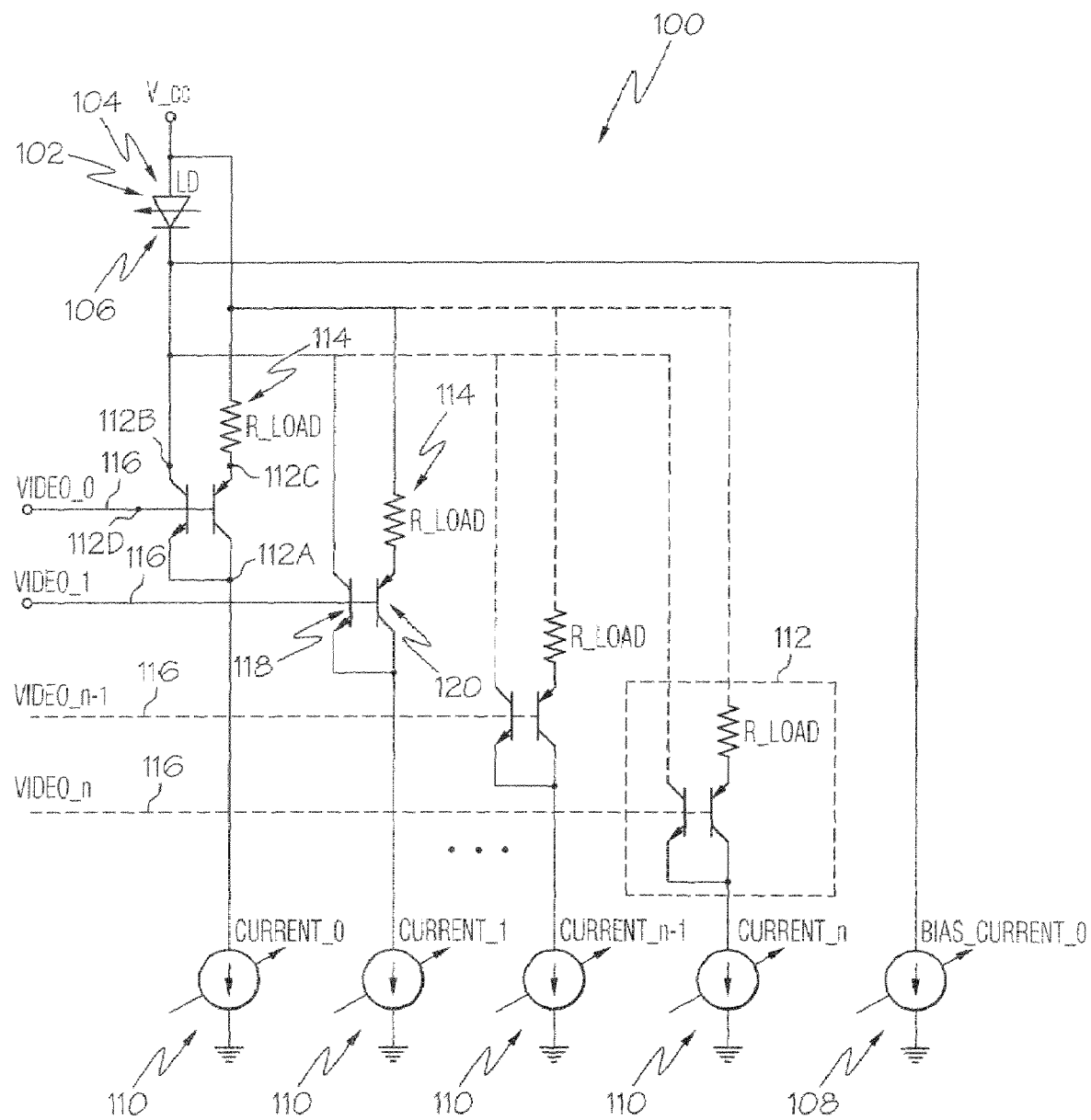
FIG. 3 is a schematic illustration of a switched current driver for a laser source that may be utilized in an electrophotographic device.

Referring to FIG. 3, a generalized topology 100 is illustrated for control of a laser source in an electrophotographic device, such as the apparatus 10. The generalized topology 100 comprises a laser source 102, e.g., a conventional laser diode having an anode 104 and a cathode 106. The anode 104 of the laser diode 102 is tied to a supply voltage, designated as V_cc. The topology 100 further includes one or more bias sources 108, (one bias source is shown for clarity of discussion) and two or more switched drive sources 110 (labeled Current_0 through Current_n as shown). Each bias source 108 may be fixed or programmable in current drive and is tied to the cathode 106 of the laser diode 102.

Each switched drive current source 110 may be fixed or programmable in drive current, e.g., to accommodate changing device characteristics, and is coupled to the cathode 106 of the laser source 102 through a corresponding switch 112. As shown, each switch 112 comprises a first terminal 112A coupled to a corresponding switched drive current source 110, a second terminal 112B coupled to the cathode 106 of the laser source 102, a third terminal 112C coupled to V_cc through a load resistor 114 (designated R_LOAD), and a control terminal 112D that is coupled to a corresponding control signal line 116.

As schematically represented, a complimentary pair of semiconductor devices forms each switch 112. In particular, each switch 112 is shown as an npn transistor 118 and a pnp transistor 120. The base of the npn and pnp transistors 118, 120 each couple to their corresponding control signal line 116. The emitter of the npn transistor 118 and the collector of the pnp transistor 120 each couple to the corresponding current source 110. The collector of the npn transistor is coupled to the cathode 106 of the laser diode 102 and the emitter of the pnp transistor 120 is coupled to the load resistor 114, which is further coupled to V_cc.

In operation of the switch 112, a first logic value, e.g., a voltage corresponding to V_cc, may be applied on a corresponding one of the control signal lines 116. This causes the switch 116 to enter a first state, wherein the first logic value turns ON the npn transistor 118 and turns OFF the pnp transistor 120. When the switch 112 is in the first state, the npn transistor 118 acts substantially like a short circuit, allowing the associated current source 110 to drive the laser diode 102. The pnp transistor acts substantially as an open circuit, thus having negligible effect on the laser diode 102.

Correspondingly, a second logic value, e.g., a voltage corresponding to 0V, may be applied to the corresponding control signal line 116. This causes the switch 112 to enter a second state, wherein the second logic value turns OFF the npn transistor 118 and turns ON the pnp transistor 120. When the switch 112 is in the second state, the npn transistor 118 acts substantially like an open circuit, thus the current source 116 does not draw significant current through the npn transistor 118. However, the pnp transistor 120 acts substantially like a closed circuit, thus the current source 110 sinks current through the pnp transistor and the load resistor 114. Thus, while the switch 112 is in the second state, the corresponding drive source 110 does not significantly contribute to the amount of current flowing through the laser diode 102.

The control signal line 116 of each drive current source 110 may be coupled to a corresponding unique control signal, e.g., from the controller 12. Thus, each drive current source 110 may be independently switched ON to contribute to the current applied to the laser diode 102, or switched OFF to not significantly contribute to the drive of current through the laser diode 102. Moreover, as will be described in greater detail below, one or more of the drive current sources 110 (and optionally one or more bias current sources 108) can have a programmable current capability.

The switches 112 may be implemented using any suitable switching structures. For example, the switches 112 may alternatively be constructed from field effect transistors (FETs), integrated circuit (IC) chips, or any suitable device that can implement a switching function, e.g., to steer the flow of current from a corresponding current source between the laser diode 102 and a corresponding dummy load, such as the load resistor 114 or other active or passive load.

As an example, assume a case where there is a single bias source 108 and two drive current sources 10, designated as Current_0 and Current_1. Current_0 is coupled to a first switch 112, which is controlled by a control signal VIDEO_0 on its control line 116 to switch Current_0 between the cathode of the laser diode 102 and its associated load resistor 114. Similarly, Current_1 is coupled to a second switch 112, which is controlled by a control signal VIDEO_1 on its control line 116 to switch Current_1 between the cathode 106 of the laser diode 102 and its associated load resistor 114. Further, assume that the current that is sunk by the bias current source 108 is Ibias, the current that is sunk by Current_0 is IC_0, the current that is sunk by Current_1 is IC_1 and the current drawn through the laser diode 102 is I_laser.

If VIDEO_0 and VIDEO_1 are both at a low logic level, then I_laser=Ibias.

If VIDEO_0 is at a high logic level and VIDEO_1 is at a low logic level, then I_laser=Ibias+IC_0

If VIDEO_0 is at a low logic level and VIDEO_1 is at a high logic level, then I_laser=Ibias+IC_1.

If VIDEO_0 and VIDEO_1 are both at a high logic level, then I_laser=Ibias+IC_0+IC_1.

The above exemplary set of equations for laser diode current I_laser is expandable to any number of bias current sources 108 and drive current sources 110.

Figure 4:
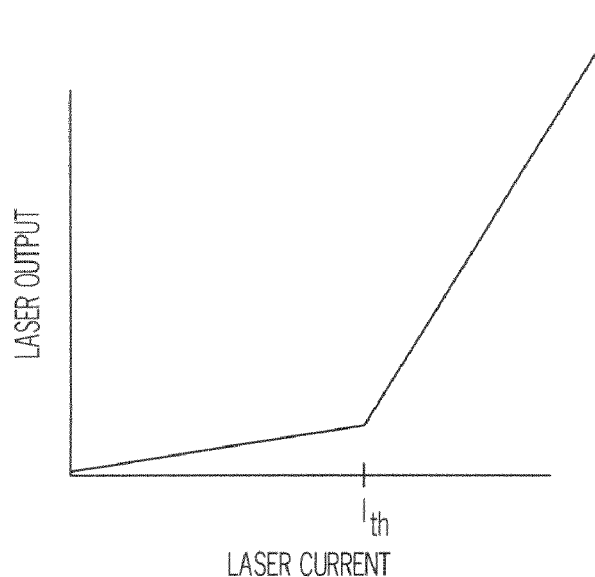
FIG. 4 is a chart of laser current vs. laser output power.

With reference to FIG. 4, a plot illustrates the relationship of light power output of the laser diode 102 as a function of the current that flows through the laser diode 102. As shown, the laser current along the axis of abscissa versus optical power along the axis of ordinate. As the current increases from zero, the laser diode 102 emits some low level of light that is proportional to the current flowing therethrough. At some level of current, the efficiency with which the laser diode emits light increases dramatically and the slope of the curve increases but remains generally constant at this larger slope value.

A minimum current of increased current efficiency, i.e., the current at which the slope discontinuity occurs, is referred to herein as the threshold current Ith. When the current being supplied to the laser diode is less than the threshold current Ith, atoms in the laser diode's cavity may be excited so as to cause light to be emitted similar to that produced by light emitting diodes (LEDs). However, the current supplied to the laser diode must reach a level greater than or equal to the threshold current Ith in order for the laser diode to enter a lasing mode of operation and thus emit laser light. The slope of the power curve above the threshold is referred to herein as the differential efficiency ($\eta$). In general, the determination of laser output power can be simplified to the expression:

$$p = \max\left(\frac{p_{th}i}{i_{th}}, (i - i_{th})\eta\right)$$

The threshold current, differential efficiency and power at the threshold generally change as a function of temperature and the age of the laser diode device. Moreover, the above parameters can vary from laser diode to laser diode.

Referring back to the previous example with reference to FIG. 3, including a single bias source 108 and two drive current sources 110, designated as Current_0 and Current_1. Assume that a desired laser power is p0 when VIDEO_0 is active and VIDEO_1 is inactive Further assume that a desired laser power is p1 when VIDEO_1 is active and VIDEO_0 is inactive. Further, assume that both the laser power $p_0$ and $p_1$ are above the threshold current Ith. The magnitudes of the two drive current sources 110, Current_0 and Current_1, can be described as follows:

$$p_0 = (i_0 + i_B - i_{th})\eta$$

$$p_1 = (i_1 + i_B - i_{th})\eta$$

where $i_0$ is the current from source Current_0, $i_1$ is the current from source Current_1, $i_B$ is the current from the bias current source 108 and $i_{th}$ is the threshold current.

Further, assume that if both VIDEO_0 and VIDEO_1 are active at the same time, then the laser power is the sum of the laser powers $p_0$ and $p_1$. Thus:

$$p_0 + p_1 = (i_0 + i_1 + i_B - i_{th})\eta$$

If the magnitude of the current sources is stated in terms of the diode characteristics, then the above equations may be simplified to:

$$i_0 = p_0/\eta$$

$$i_1 = p_1/\eta$$

$$i_B = i_{th}$$

In order to determine the required magnitudes of the bias current, the current $i_0$ of Current_0 source and the current $i_1$ of the Current_1 source for power $p_0$ and $p_1$ respectively, a requirement may be imposed that constrains the exemplary system so that the bias current $i_B$ is assumed to approximate the threshold current. As such, when both VIDEO_0 and VIDEO_1 are active, the resultant power, designated $p_2$ is:

$$p_2 = p_0 + p_1$$

According to one aspect of the present invention, a reference signal $r_0$ is defined, which is numerically equal to the power $p_0$. Similarly, a reference signal $r_1$ is defined, which is numerically equal to the laser power $p_1$. Given three current source magnitudes, $i_0$, $i_1$ and $i_B$, error signals corresponding to output power error measures can be calculated for each of the three laser diode power levels as follows:

$$\epsilon_0 = p_0 - r_0 = (i_0 + i_B - i_{th})\eta - r_0$$

$$\epsilon_1 = p_1 - r_1 = (i_1 + i_B - i_{th})\eta - r_1$$

$$\epsilon_2 = p_2 - r_0 - r_1 = (i_0 + i_1 + i_B - i_{th})\eta - r_0 r_1$$

If the output power error measures in the laser diode power are combined linearly to change each of the current source magnitudes, then the error $\epsilon_0$, $\epsilon_1$, $\epsilon_2$ are each reduced to zero over time. Thus, in general terms, $di/dt = -K\epsilon$ In the present example, K comprises a 3×3 matrix:

$$i = \begin{bmatrix} i_0 \\ i_1 \\ i_B \end{bmatrix} \qquad \varepsilon = \begin{bmatrix} \varepsilon_0 \\ \varepsilon_1 \\ \varepsilon_2 \end{bmatrix}$$

$$\varepsilon = \left(\begin{bmatrix} 1 & 0 & 1 \\ 0 & 1 & 1 \\ 1 & 1 & 1 \end{bmatrix} i - i_{th} \begin{bmatrix} 1 \\ 1 \\ 1 \end{bmatrix}\right) - \begin{bmatrix} r_0 \\ r_1 \\ r_0 + r_1 \end{bmatrix}$$

$$\frac{1}{\eta}\frac{di}{dt} + K\begin{bmatrix} 1 & 0 & 1 \\ 0 & 1 & 1 \\ 1 & 1 & 1 \end{bmatrix} i = K\left(i_{th}\begin{bmatrix} 1 \\ 1 \\ 1 \end{bmatrix} + \frac{1}{\eta}\begin{bmatrix} r_0 \\ r_1 \\ r_0 + r_1 \end{bmatrix}\right)$$

The solution for i thus takes the form:

$$i - i_0 = \left\{I - \exp\left(-\eta K \begin{bmatrix} 1 & 0 & 1 \\ 0 & 1 & 1 \\ 1 & 1 & 1 \end{bmatrix} t\right)\right\}(i_{ss} - i_0)$$

where $i_0$ is the value of i at t=0 and $i_{ss}$ is the steady state value of i at (t→4).

The steady state solution may be expressed as:

$$i_{ss} = \begin{bmatrix} 1 & 0 & 1 \\ 0 & 1 & 1 \\ 1 & 1 & 1 \end{bmatrix}^{-1}\left(i_{th}\begin{bmatrix} 1 \\ 1 \\ 1 \end{bmatrix} + \frac{1}{\eta}\begin{bmatrix} r_0 \\ r_1 \\ r_0 + r_1 \end{bmatrix}\right) = \begin{bmatrix} 0 \\ 0 \\ i_{th} \end{bmatrix} + \frac{1}{\eta}\begin{bmatrix} r_0 \\ r_1 \\ 0 \end{bmatrix}$$

The stability of the system is dependent upon the behavior of the exponential term in the above equation. However, a uniform rate of convergence may be forced by requiring the matrix K to be equal to k times a nontrivial diagonal matrix, e.g., an identity matrix:

$$K\begin{bmatrix} 1 & 0 & 1 \\ 0 & 1 & 1 \\ 1 & 1 & 1 \end{bmatrix} = k\begin{bmatrix} 1 & 0 & 0 \\ 0 & 1 & 0 \\ 0 & 0 & 1 \end{bmatrix}$$

$$k = k\begin{bmatrix} 0 & -1 & 1 \\ -1 & 0 & 1 \\ 1 & 1 & -1 \end{bmatrix}$$

$$\frac{di}{dt} = -\eta k \begin{bmatrix} 0 & -1 & 1 \\ -1 & 0 & 1 \\ 1 & 1 & -1 \end{bmatrix}\begin{bmatrix} p_0 - r_0 \\ p_1 - r_1 \\ p_2 - r_0 - r_1 \end{bmatrix}$$

This can be written as the following three scalar equations:

$$\frac{di_0}{dt} = -\eta k(p_2 - p_1 - r_0)$$

$$\frac{di_1}{dt} = -\eta k(p_2 - p_0 - r_1)$$

$$\frac{di_B}{dt} = +\eta k(p_2 - p_1 - p_0)$$

The above equations may be used to establish and periodically update the magnitudes of current sources in a dual switched current laser diode driver structure.

Exemplary Hardware Implementation

Figure 5:
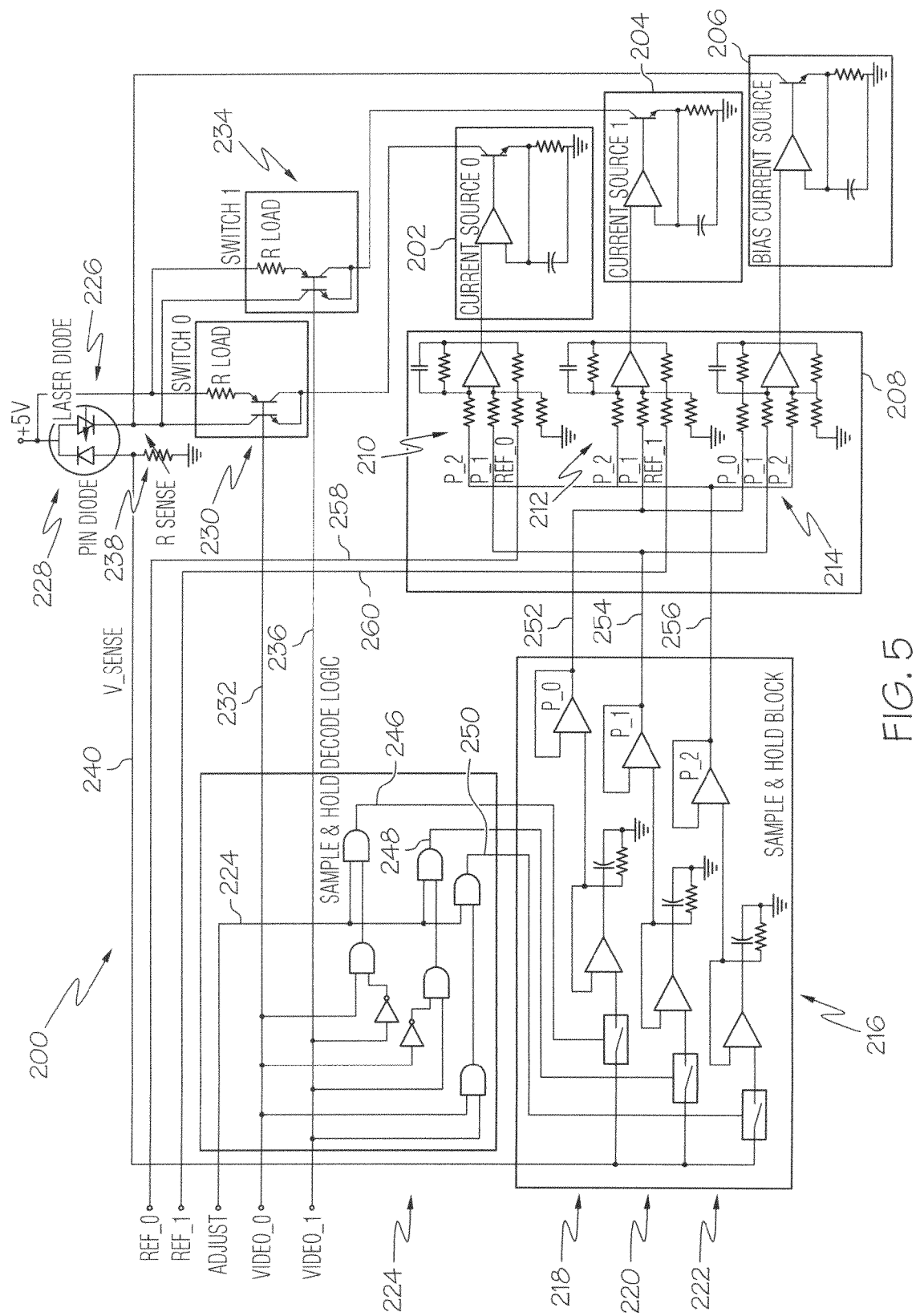
FIG. 5 is a schematic illustration of an exemplary laser driver circuit for driving a corresponding laser source.

Referring to FIG. 5, an implementation of a dual switched current source laser diode driver circuit 200 is illustrated. The laser diode driver circuit 200 comprises two laser drive current sources including a first current source 202 (CURRENT SOURCE 0) and a second current source 204 (CURRENT SOURCE 1), as well as a third current source 206, which is also referred to herein as bias source 206 (BIAS CURRENT SOURCE). A compensator, e.g., a compensation block 208 is provided for controlling the current sources 202, 204, 206 and includes a first compensation circuit 210 that controls the first current source 202. A second compensation circuit 212 controls the second current source 204. Similarly, a third compensation circuit 214 controls the bias current source 206. A sampler, e.g., a sample and hold block 216 outputs control signals that are coupled to the compensation block 208 and comprises a first sample and hold circuit 218, a second sample and hold circuit 220 and a third sample and hold circuit 222. The first, second and third sample and hold circuits 218, 220, 222 are selected based upon sample and hold decode logic 224.

The laser diode driver circuit 200 is coupled to a laser diode 226 (e.g., one of the laser diodes 56K, 56Y, 56M, 56C described with reference to FIGS. 1-2) and a corresponding PIN diode 228. The anode of the laser diode 226 is coupled to a suitable supply voltage. The first current source 202 is coupled to the cathode of the laser diode 226 via a first switch 230 (SWITCH 0). The first switch 230 is controlled by a signal, designated VIDEO_0, which is carried on the first switch control line 232. When the VIDEO_0 signal is in a first state, the current from the first current source 202 affects the drive current applied to the laser diode 226. When the VIDEO_0 signal is in a second state, the current from the first current source 202 is drawn through the resistive dummy load of the first switch 230 in a manner analogous to that described with reference to the switches 112 in FIG. 3.

Similarly, the second current source 204 is coupled to the cathode of the laser diode 226 via a second switch 234 (SWITCH 1). The second switch 234 is controlled by a signal, designated VIDEO_1, which is carried on the second switch control line 236. When the VIDEO_1 signal is in a first state, the current from the second current source 204 affects the drive current applied to the laser diode 226. When the VIDEO_1 signal is in a second state, the current from the second current source 204 is drawn through the resistive dummy load of the second switch 234 in a manner analogous to that described with reference to the switches in FIG. 3.

The output of the bias current source 206 (BIAS CURRENT SOURCE) couples to the cathode of the laser diode 226, As such, the bias current is always applied to the laser diode 226 regardless of the value of laser modulation data.

When the laser diode 226 is energized, the magnitude of the output power is measured by sensing the current leakage through the back-biased PIN Diode 228. In practice, the PIN diode 228 is typically packaged with the laser diode 226. The current sensed by the PIN diode 228 is converted to a voltage, designated V_SENSE, by a current to voltage converter 238, which may comprise a fixed resistance, variable resistance, programmable resistance, current to voltage amplifier or other suitable device to convert the output current of the PIN diode 228 to a corresponding output voltage V_SENSE. For purposes of illustration, the current to voltage converter 238 is illustrated as a variable resistor, designated R_SENSE. The voltage V_SENSE is carried on a feedback signal line 240 to the first sample and hold circuit 218, the second sample and hold circuit 220 and the third sample and hold circuit 222.

The sample and hold decode logic 224 of the laser diode driver circuit 200 receives as inputs, the VIDEO_0 signal carried on the first switch control line 232, the VIDEO_1 signal carried on the second switch control line 236 and an ADJUST signal carried on an adjust signal line 244. The sample and hold decode logic 232 further comprises a first output line 246 that carries a first sample and hold control signal SH_Enable0, a second output line 248 that carries a second sample and hold control signal SH_Enable1 and a third output line 250 that carries a third sample and hold control signal SH_Enable2. The implemented logic is shown in the truth table below. Notably, when the ADJUST signal is inactive, the SH_Enable_2, SH_Enable_1 and SH_Enable_0 signals are all inactive. When the ADJUST signal is active, VIDEO_1 is inactive and VIDEO_0 is active, then SH_Enable0 is active. When the ADJUST signal is active, and VIDEO_1 is active and VIDEO_0 is inactive, then SH_Enable1 is active. When ADJUST, VIDEO_1 and VIDEO_0 are all active, then SH_Enable2 is active. An "X" represents a "don't care" state.

| ADJUST | VIDEO_1 | VIDEO_0 | SH_Enable_2 | SH_Enable_1 | SH_Enable_0 |
|---|---|---|---|---|---|
| 0 | X | X | 0 | 0 | 0 |
| 1 | 0 | 0 | 0 | 0 | 0 |
| 1 | 0 | 1 | 0 | 0 | 1 |
| 1 | 1 | 0 | 0 | 1 | 0 |
| 1 | 1 | 1 | 1 | 0 | 0 |

The first output line 246 of the sample and hold decode logic 224 is coupled to a control circuit, e.g., a switch, of the first sample and hold circuit 218 such that the SH_Enable0 signal switches the first sample and hold circuit 218 between a first and second state. The first sample and hold circuit 218 samples the value of the V_SENSE signal when in the first state and holds its previously sampled value of V_SENSE when in the second state. The first sample and hold circuit 218 further outputs a first sample and hold output signal P_0 on a first sample and hold output line 252 to the compensation circuit 208 as will be described in greater detail below.

The second output line 248 of the sample and hold decode logic 224 is coupled to a control circuit, e.g., a switch, of the second sample and hold circuit 220 such that the SH_Enable1 signal switches the second sample and hold circuit 220 between a first and second state. In a manner analogous to the first sample and hold circuit 218, the second sample and hold circuit 220 samples the value of the V_SENSE signal when in the first state and holds its previously sampled value of V_SENSE when in the second state. The second sample and hold circuit 220 further outputs a second sample and hold output signal P_1 on a second sample and hold output line 254 to the compensation circuit 208 as will be described in greater detail below.

The third output line 250 of the sample and hold decode logic 224 is coupled to a control circuit, e.g., a switch, of the third sample and hold circuit 222 such that the SH_Enable2 signal switches the third sample and hold circuit 222 between a first and second state. In a manner analogous to the first sample and hold circuit 218, the third sample and hold circuit 222 samples the value of the V_SENSE signal when in the first state and holds its previously sampled value of V_SENSE when in the second state. The third sample and hold circuit 222 further outputs a third sample and hold output signal P_2 on a third sample and hold output line 256 to the compensation circuit 208 as will be described in greater detail below.

The first sample and hold output P_0 is a measure of the actual power output by the laser diode 226 when the first current source 202 and the bias current source 206 are applied to the cathode of the laser diode 226 (and the second current source 204 is turned off). The second sample and hold output P_1 is a measure of the actual power output by the laser diode 226 when the second current source 204 and the bias current source 206 are applied to the cathode of the laser diode 226 (and the first current source 202 is turned off) Similarly, the third sample and hold output P_2 is a measure of the actual power output by the laser diode 226 when the first and second current sources 202, 204, as well as the bias current source 206 are applied to the cathode of the laser diode 226.

The first compensation circuit 210 receives a REF_0 input signal carried on a first reference line 258. The first compensation circuit 210 also receives as inputs, the sample and hold output signals P_1 and P_2. The second compensation circuit 212 receives a REF_1 input signal carried on a second reference line 260. The second compensation circuit 210 also receives as inputs, the sample and hold output signals P_0 and P_2. Further, the third compensation circuit 214 receives as inputs, the sample and hold output signals P_0, P_1 and P_2.

The REF_0 signal is a control signal, e.g., as provided by the controller 12, that represents a measure of the desired output power of the laser diode 226 when the first current source 202 and the bias current source 206 are applied to the cathode of the laser diode 226 (and the second current source 204 is turned off). Similarly, the REF_1 signal is a control signal, e.g., as provided by the controller 12, that represents a measure of the desired output power of the laser diode 226 when the second current source 204 and the bias current source 206 are applied to the cathode of the laser diode 226 (and the first current source 202 is turned off).

In this exemplary configuration, the first compensation circuit 210 implements equation $$\frac{di_0}{dt} = -\eta k(p_2 - p_1 - r_0)$$

defined above. The second compensation circuit 212 implements equation $$\frac{di_1}{dt} = -\eta k(p_2 - p_0 - r_1)$$

defined above, and the third compensation circuit 214 implements equation $$\frac{di_B}{dt} = +\eta k(p_2 - p_1 - p_0)$$

also defined above. In this regard, the first, second and third compensation circuits 210, 212, 214 implement their respective equations, including the computation of their scalar gain value ηk, using an appropriate selection of resistors, capacitors and other necessary electrical components in an operational amplifier circuit.

Figure 6:
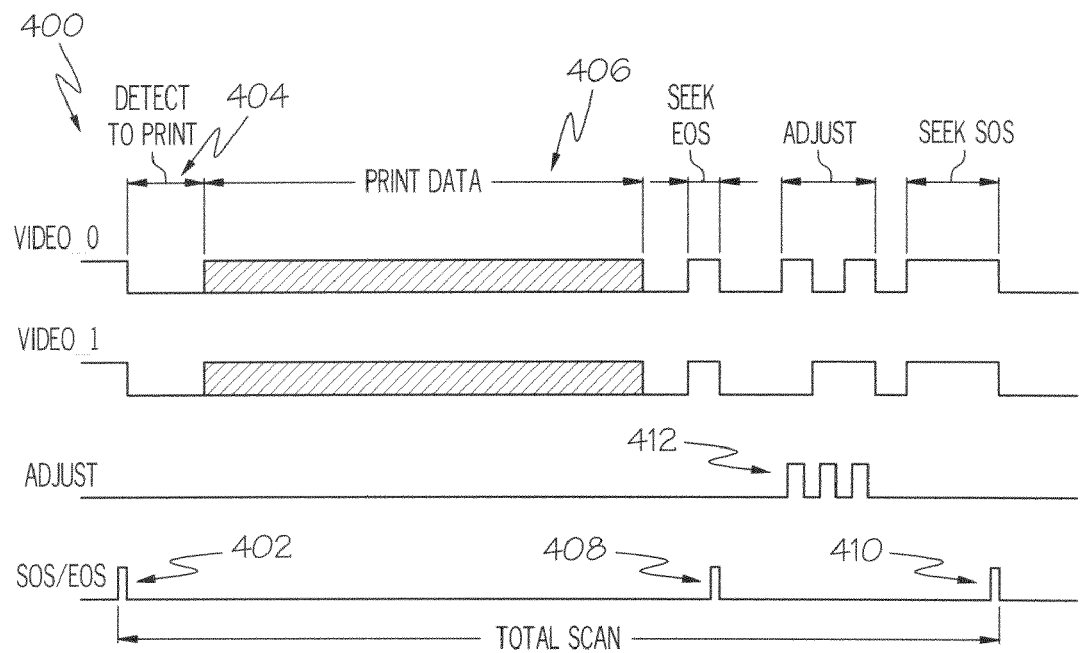
FIG. 6 is a timing diagram of a control sequence which may be used to calibrate the laser driver illustrated in FIG. 5.

The sampling of the laser power at each of the various laser power states, e.g., VIDEO_0 OFF and VIDEO_1 ON; VIDEO_0 ON and VIDEO_1 OFF; and VIDEO_0 and VIDEO_1 both ON, may be performed during the non-printing portion of each scan line. With reference to FIG. 6, a timing diagram 400 illustrates several exemplary timing control signals during a typical scan. The scan begins when a start of Scan (SOS) sensor detects the laser beam and a SOS/EOS pulse output at 402. As shown, both the VIDEO_0 and VIDEO_1 signals are active during start of scan detection so that the laser beam is turned ON as it is swept across the corresponding SOS detector. However, any suitable method may be used to detect the start of scan sensor. The laser is then turned OFF (both VIDEO_0 and VIDEO_1 are inactive) for some time designated as Detect to Print at 404 until the laser beam is over the print margin.

At this point, the laser modulation data for the scan line controls both Video signals (VIDEO_0 and VIDEO_1) to selectively switch turn on and off each current source CURRENT_SOURCE_0 and CURRENT_SOURCE_1, depending upon the print requirements, as a line of print data is written to the photoconductive surface at 406. For example, each written PEL may assume one of four states, including an OFF State, an ON state driven by CURRENT_SOURCE_0, an ON state driven by CURRENT_SOURCE_1, or an ON state driven by CURRENT_SOURCE_0 and CURRENT_SOURCE_1.

At the opposite print margin, the laser beam is turned off. Just before the laser beam reaches the end-of-scan (EOS) sensor, the laser beam is turned back ON again, e.g., by asserting the VIDEO_0 and/or VIDEO_1 signals, or by using any other suitable method to detect the end of scan sensor. When the end of scan is detected, the laser beam has swept past the image area of the photoconductive drum and an SOS/EOS pulse is asserted at 408.

Referring generally to FIGS. 5 and 6, at some point between EOS at 408 and a subsequent SOS operation at 410, a power adjustment cycle may be performed at 412. During the power adjustment cycle, one or more of the first, second or third current sources 202, 204, 206 is calibrated. For example to calibrate each of the first, second and third current sources 202, 204, 206, the ADJUST signal provides three calibration pulses. During each pulse, a select one of the first, second or third sample and hold outputs P_0, P_1 or P_2 is calibrated.

As shown in the exemplary timing diagram, when the first ADJUST pulse is active, the VIDEO_0 signal is active and the VIDEO_1 signal is inactive. Thus, the current through the laser diode 226 is $I_{diode}=I_{Bias}+I_0$. The laser diode output is measured by the PIN diode 228. The sample and hold decode logic 224 activates the first sample and hold circuit 218 of the sample and hold block 216 to sample the V_SENSE signal. The power level P_0 is thus determined based upon the present output level $I\_0$ of the first current source 202.

When the second ADJUST pulse is active, the VIDEO_0 signal is inactive and the VIDEO_1 signal is active. Thus, the current through the laser diode 226 is $I_{diode}=I_{Bias}+I_1$. The laser diode output is measured by the PIN diode 228. The sample and hold decode logic 224 activates the second sample and hold circuit 220 of the sample and hold block 216 to sample the V_SENSE signal. The power level P_1 is thus determined based upon the present output level I_1 of the second current source 204.

When the third ADJUST pulse is active, the VIDEO_0 signal is active and the VIDEO_1 signal is active. Thus, the current through the laser diode 226 is $I_{diode}=I_{Bias}+I_0+I_1$. The laser diode output is measured by the PIN diode 228. The sample and hold decode logic 224 activates the third sample and hold circuit 222 of the sample and hold block 216 to sample the V_SENSE signal. The power level P_2 is thus determined based upon the present output level I_0 of the first current source 202 and the present output level I_1 of the second current source 204. After the adjustment cycle, the laser diode is ready to be turned off, then turned back on again to start searching for the next start of scan signal.

Figure 7:
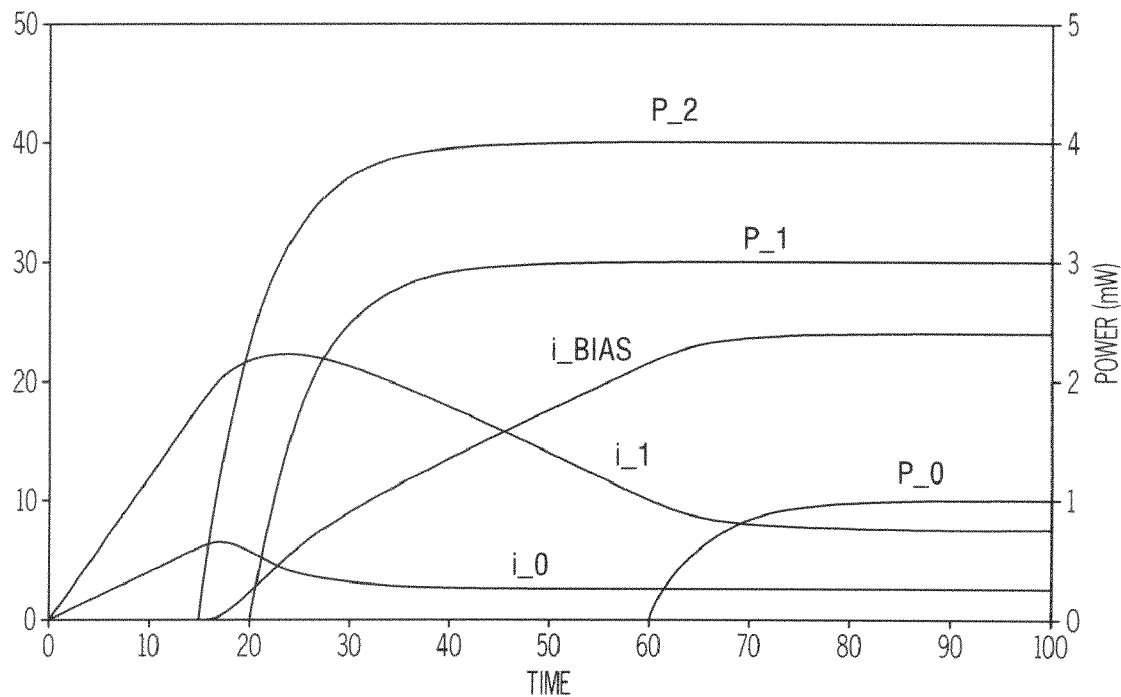
FIG. 7 is a plot of simulated data showing the laser driver currents of the system of FIG. 5 converging over time.

With reference to FIG. 7, a diagram 400 illustrates a simulated transient response plot of the circuit of FIG. 5 showing convergence of the current sources 202, 204, 206 and of the sample and hold block outputs P_0, P_1 and P_2. Over a period of time, the first compensation circuit 208 adjusts the level of current delivered by the first current source 202 such that the actual power output of the laser diode 226 corresponds to the input control signal REF_0 based upon inputs REF_0, P_2 and P_1, as well as any scalar gain adjustments, e.g., the value ηk in the above example. The second compensation circuit 212 adjusts the level of current delivered by the second current source 204 such that the actual power output of the laser diode 226 corresponds to the input control signal REF_1, based upon inputs REF_1, P_2 and P_0, as well as any scalar gain adjustments, e.g., the value ηk in the above example. The third compensation circuit 214 adjusts the level of current delivered by the bias current source 206 to correspond to the threshold current Ith based upon inputs P_0, P_1 and P_2, as well as any scalar gain adjustments, e.g., the value ηk in the above example. As such, the bias current 206 is updated as well as the first and second (drive) current sources 202, 204.

Although discussed with reference to a hardware implementation in FIG. 5 for purposes of illustration and clarity of discussion, the systems and methods herein can also be performed in software, or in a combination of hardware and software. For example, the controller 12 may comprise any combination of hardware and/or software processing that replaces functions of the laser driver described with reference to FIG. 5, such as the compensation circuit 208, the sample and hold block 216 and/or the sample and hold decode logic 224. The hardware and or software may also comprise a separate ASIC, microcontroller or other processing device on the printhead circuitry 40, or a separate processor or processing logic located elsewhere in the apparatus 10

For example, the printhead circuitry 40 may comprise a processor that outputs a first signal, a second signal and a third signal, e.g., a pulse width modulated signals that are filtered/converted to correspondingly control the first current source 202, the second current source 204 and the bias current source 206. Under this arrangement, the output of the first and second current sources 202, 204 are coupled to respective switches 230 and 234 substantially as described with reference to FIG. 5. Further, the bias current source 206 and the switches 230 and 234 couple to the laser diode 226 substantially as described with reference to FIG. 5.

In this exemplary embodiment, the output current of the PIN diode 228 is converted to the V_SENSE signal by the current to voltage converter 238. The V_SENSE signal is fed back to the controller on a suitable control line and may optionally be buffered, scaled, filtered, etc. The desired laser power reference signals REF_0 and REF_1 may be digital values stored in respective registers or other memory associated with the controller. Moreover, the scalar values for η and/or k may be may be stored in respective registers or other memory associated with the controller. The controller computes the appropriate current drive signals for the first and second current sources 202, 204, as well as for the bias current source 206, based upon the equations:

$$\frac{di_0}{dt} = -\eta k(p_2 - p_1 - r_0);$$

$$\frac{di_1}{dt} = -\eta k(p_2 - p_0 - r_1);$$

$$\frac{di_B}{dt} = +\eta k(p_2 - p_1 - p_0).$$

Under this arrangement, it is also possible for the controller to periodically vary the constant ηk to further accommodate changing laser characteristics.

The laser diode driver circuit 200 is illustrated for the case of two programmable laser drive sources and a bias current source 202, 204, 206. Other numbers of drive sources and bias current sources may alternatively be utilized as set out in greater detail herein.

The various aspects of the present invention may be utilized in binary printers, e.g., to compensate for bow, skew and other processing position errors, such as using Pel synthesis as set out in U.S. patent application Ser. No. 10/757,130, entitled "Method And Apparatus For Minimizing Visual Artifacts In Images Generated By An Electrophotographic Machine", to the same assignee, which is hereby incorporated by reference in its entirety. The various aspects of the present invention may also be used to control the size and/or total energy of each written Pel, e.g., such as when performing halftoning, scan line position compensation, etc. Numerous other uses are well within the spirit of the various aspects of the present invention.

As will be appreciated by one of skill in the art, the various aspects of the present invention may be embodied as a method, system, or computer program product. Moreover, the various aspects of the present invention may take the form of an entirely hardware embodiment or an embodiment combining software and hardware aspects.

The present invention is described below with reference to schematics, flowchart illustrations and/or block diagrams of methods and apparatus systems according to embodiments of the invention. It will be understood that each block of the flowchart illustrations and/or block diagrams, and combinations of blocks in the flowchart illustrations and/or block diagrams may also be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The equations in the specification and the flowcharts and block diagrams in the Figures illustrate the architecture, functionality, and operation of possible implementations of systems, methods and computer program products according to various embodiments of the present invention. In this regard, each equation or block in the flowchart or block diagrams may represent a module, segment, or portion of code, which comprises one or more executable instructions for implementing the specified logical function(s). It should also be noted that, in some alternative implementations, the functions might occur out of the order as presented herein. For example, two blocks shown in succession may, in fact, be executed substantially concurrently, or the blocks may sometimes be executed in the reverse order, depending upon the functionality involved. It will also be noted that each equation in the specification, and each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. For example, the various aspects of the present invention may be implemented in a copier, facsimile machine, multi-function machine, or other suitable structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having thus described the invention of the present application in detail and by reference to preferred embodiments thereof, it will be apparent that modifications and variations are possible without departing from the scope of the invention defined in the appended claims.

What is claimed is:

1. A method of controlling current sources in a laser driver comprising:
    providing a laser source;
    providing at least one bias current source coupled to said laser source;
    providing at least two switched current sources, each independently controllable to be switchably coupled to said laser source;
    providing a laser power control signal that corresponds to a desired laser output power for each of said at least two switched current sources;
    defining an output power error measure based upon an error between a measured laser output power and said desired laser output power for each of said at least two switched current sources;
    characterizing a control system in which said output power error measures combine to change a magnitude of each of said at least two switched current sources and at least one bias current source such that said output power error measures converge over time;
    sampling laser output power for each of said at least two switched current sources during a non-printing portion of a scan operation; and
    adjusting said magnitudes of said at least two switched current sources and said at least one bias current source based upon said characterized control system and said sampled laser output power for each of said at least two switched current sources.

2. The method according to claim 1, wherein said defining an output power error measure based upon an error between a measured laser output power and said desired laser output power for each of said at least two switched current sources comprises:
    defining each output power error measure at least in terms of a corresponding one of said laser power control signals, a magnitude of current applied by a corresponding one of said at least two switched current sources and at least one laser source characteristic.

3. The method according to claim 2, wherein said defining each error measure at least in terms of said at least one laser source characteristic comprises defining each error measure at least in terms of a differential efficiency of a laser diode.

4. The method according to claim 2, further comprising programming each said at least one bias current source so that a total bias current applied to said laser source approximates a threshold current level of said laser source such that a laser power output by said laser source when each of said at least two switched current sources drive said laser source individually is substantially equal to a sum of laser power output by said laser source when said at least two switched current sources drive said laser source individually.

5. The method according to claim 4, further comprising defining an additional error measure for an output power derived from said sum of laser output power.

6. The method according to claim 1, wherein said characterizing a control system in which said error measures combine to change a magnitude of each of said at least two switched current sources and said at least one bias current source such that said error measures converge over time further comprises:
    defining said magnitude of said at least two switched current sources and a magnitude of said at least one bias current source in terms of a matrix; and
    forcing a rate of convergence for each of said at least two switched current sources and said at least one bias current source by multiplying said matrix by a corresponding identity matrix and a scalar gain setting constant.

7. The method according to claim 1, wherein said sampling laser output power for each of said at least two switched current sources during a non-printing portion of a scan operation comprises:
    successively sampling laser output power by turning one each of said at least two switched current sources independently and storing said sampled laser output power samples; and
    sampling laser output power by turning on each of said at least two switched current sources simultaneously and storing said sampled laser output power sample.

8. The method according to claim 1, wherein said characterizing a control system in which said output power error measures combine to change a magnitude of each of said at least two switched current sources and said at least one bias current source such that said output power error measures converge over time comprises combining said error measures linearly to change the magnitude of said at least two switched current sources and said at least one bias current source so that each error measure approaches zero over time.

9. The method according to claim 1, wherein said characterizing a control system in which said output power error measures combine to change a magnitude of each of said at least two switched current sources and said at least one bias current source such that said output power error measures converge over time comprises characterizing said current sources as:

$$\frac{di_0}{dt} = -\eta k(p_2 - p_1 - r_0);$$

$$\frac{di_1}{dt} = -\eta k(p_2 - p_0 - r_1); \text{ and}$$

$$\frac{di_B}{dt} = +\eta k(p_2 - p_1 - p_0);$$

wherein η defines a differential efficiency of said laser source, k is a scalar constant, p0 corresponds to a first sampling of laser output power when said laser source is driven by a first one of said at least two switched current sources, p1 corresponds to a second sampling of said laser output power when said laser source is driven by a second one of said at least two switched current sources, p2 corresponds to a third sampling of said laser output power when said laser source is driven by both said first one and said second one of said current sources are on simultaneously, r0 is a reference signal numerically equal to the laser power p0 and r1 is a reference signal numerically equal to the laser power p1.

10. A laser driver comprising:
a laser source;
a bias current source coupled to said laser source;
a first switched current source switchably coupled to said laser source;
a first laser power control signal that corresponds to a first desired laser output power for said first switched current source;
a second switched current source switchably coupled to said laser source;
a second laser power control signal that corresponds to a second desired laser output power for said second switched current source;
a sampler arranged to store:
    a first sampled measure of output power from said laser source when said first switched current source is driving said laser source and said second switched current source is not driving said laser source,
    a second sampled measure of output power from said laser source when said second switched current source is driving said laser source and said first switched current source is not driving said laser source, and
    a third sampled measure of output power when both said first and second switched current sources are driving said laser source; and
a compensator that adjusts a magnitude of each of said first and second switched current sources and said bias current source such that output power error measures of said first sampled measure of output power relative to said first laser power control signal, said second sampled measure of output power relative to said second laser power control signal and said third sampled measure of output power relative to a combination of said first and second laser power control signals combine to change a magnitude of each of said two switched current sources and said one bias current source such that said output power error measures converge over time.

11. The laser driver according to claim 10, further comprising
a first switch having a first terminal coupled to said first switched current source, a second terminal coupled to said laser source and a first switch control terminal;
a first control signal coupled to said first switch control terminal, said first control signal controlling said first switch to selectively couple said first current source to said laser source or a first dummy load;
a second switch having a first terminal coupled to said second current source, a second terminal coupled to said laser source and a second switch control terminal; and
a second control signal coupled to said second switch control terminal, said second control signal controlling said second switch to selectively couple said second current source to said laser source or a second dummy load.

12. The laser driver according to claim 10, wherein said compensator adjusts said magnitude of said first switched current source based upon said second and third sampled measures of output power and said first laser power control signal, and said compensator adjusts said magnitude of said second switched current source based upon said first and third sampled measures of output power and said second laser power control signal.

13. The laser driver according to claim 12, wherein:
said compensator adjusts said magnitude of said first switched current source based upon the equation $$\frac{di_0}{dt} = -\eta k(p_2 - p_1 - r_0)$$

said compensator adjusts said magnitude of said second switched current source based upon the equation $$\frac{di_1}{dt} = -\eta k(p_2 - p_0 - r_1); \text{ and}$$

said compensator adjusts said magnitude of said bias current source based upon the equation $$\frac{di_B}{dt} = +\eta k(p_2 - p_1 - p_0)$$

wherein η defines a differential efficiency of said laser source, k is a scalar constant, p0 corresponds to said first measured output of laser power, p1 corresponds to said second measured output of laser power, p2 corresponds said third measured output of laser power, r0 is a reference signal numerically equal to the laser power p0 and r1 is a reference signal numerically equal to the laser power p1.

14. The laser driver according to claim 10, wherein said compensator adjusts said bias current source based upon said first, second and third measures of output power.

15. The laser driver according to claim 10, further comprising:
a PIN diode having a PIN diode output that feeds back a measure of laser output power to said sampler; and
sample and hold decode logic to select which of said first, second or third measures of laser output power are replaced by said PIN diode output.

16. A method of controlling a laser driver in an electrophotographic device comprising:

providing a laser source;
providing a bias current source coupled to said laser source;
providing a first switched current source switchably coupled to said laser source;
providing a second switched current source switchably coupled to said laser source;
providing a first laser power control signal corresponding to a first desired laser power output level when said first switched current source is applied to said laser source;
providing a second laser power control signal corresponding to a second desired laser power output level when said second switched current source is applied to said laser source;
sampling laser output power for each of said first and second switched current sources during a non-printing portion of a scan operation; and
adjusting said magnitudes of said first and second switched current sources and said bias current source based upon said sampled laser output power for each of said first and second switched current sources such that said output power error measures between said sampled laser output power and said first and second desired laser output power levels converge over time;
writing a plurality of Pels across a scan line by sweeping said laser source across a photoconductive drum, wherein each written Pel comprises at least two data signals that determine if each Pel is Off, or is written using said first switched current source, said second switched current source, or both said first and second switched current sources.

17. The method according to claim 16, wherein said output power error measures between said sampled laser output power and said first and second desired laser output are further defined in terms of a differential efficiency of said laser source.

18. The method according to claim 16, further comprising programming said bias current source to approximate a threshold current level of said laser source such that a laser power output by said laser source when each of said first and second switched current sources drive said laser source individually is substantially equal to a sum of laser power output by said laser source when said first and second switched current sources drive said laser source individually.

19. The method according to claim 16, wherein said adjusting said magnitudes of said first and second switched current sources and said bias current source based upon said sampled laser output power for each of said first and second switched current sources such that said output power error measures between said sampled laser output power and said first and second desired laser output power levels converge over time further comprises:

defining said magnitude of said first and second switched current sources and a magnitude of said bias current source in terms of a matrix; and forcing a rate of convergence for each of said first and second switched current sources and said bias current source by multiplying said matrix by a corresponding identity matrix and a scalar gain setting constant.

20. The method according to claim 16, wherein said adjusting said magnitudes of said first and second switched current sources and said bias current source based upon said sampled laser output power for each of said first and second switched current sources such that said output power error measures between said sampled laser output power and said first and second desired laser output power levels converge over time comprises characterizing said current sources as:

$$di0/dt = -\eta k(p_2 - p_1 - r_0);$$

$$di1/dt = -\eta k(p_2 - p_1 - r_1); \text{ and}$$

$$diB/dt = +\eta k(p_2 - p_1 - p_0);$$

wherein $\eta$ defines a differential efficiency of said laser source, k is a scalar constant, p0 corresponds to a first sampling of laser output power when said laser source is driven by said first switched current sources p1 corresponds to a second sampling of said laser output power when said laser source is driven by said second switched current source, p2 corresponds to a third sampling of said laser output power when said laser source is driven by both said first and second switched current sources simultaneously, r0 is a reference signal numerically equal to the laser power p0 and r1 is a reference signal numerically equal to the laser power p1.

* * * * *